(12) United States Patent
Wilson et al.

(10) Patent No.: US 9,136,494 B2
(45) Date of Patent: Sep. 15, 2015

(54) WHITE LIGHT EMITTING MATERIAL

(71) Applicants: CAMBRIDGE DISPLAY TECHNOLOGY LIMITED, Cambridgeshire (GB); SUMITOMO CHEMICAL CO. LIMITED, Tokyo (JP)

(72) Inventors: Richard Wilson, Cambridge (GB); Thomas Pounds, Cambridge (GB); Natasha M. Conway, Histon (GB); Ilaria Grizzi, Cambridge (GB); Antonio Guerrero Castillejo, Madrid (ES)

(73) Assignees: CAMBRIDGE DISPLAY TECHNOLOGY LIMITED, Cambridgeshire (GB); SUMITOMO CHEMICAL CO. LIMITED, Tokyo (JP)

( * ) Notice: Subject to any disclaimer, the term of this patent is extended or adjusted under 35 U.S.C. 154(b) by 68 days.

(21) Appl. No.: 13/846,844

(22) Filed: Mar. 18, 2013

(65) Prior Publication Data

US 2013/0237680 A1    Sep. 12, 2013

Related U.S. Application Data

(62) Division of application No. 12/864,430, filed as application No. PCT/GB2009/000182 on Jan. 22, 2009, now abandoned.

(30) Foreign Application Priority Data

Jan. 23, 2008   (GB) .................................. 0801227.0

(51) Int. Cl.
*C08G 79/00* (2006.01)
*C09K 11/06* (2006.01)
(Continued)

(52) U.S. Cl.
CPC ............ *H01L 51/5036* (2013.01); *C09K 11/06* (2013.01); *H01L 51/0043* (2013.01); *H01L 51/0085* (2013.01); *H05B 33/14* (2013.01); *C09K 2211/14* (2013.01);
(Continued)

(58) Field of Classification Search
CPC ...................................................... C08G 79/00
USPC .................................................... 528/395, 9
See application file for complete search history.

(56) References Cited

U.S. PATENT DOCUMENTS 5,621,131 A    4/1997    Kreuder et al.
5,723,873 A    3/1998    Yang
(Continued)

FOREIGN PATENT DOCUMENTS

CN    1948360 A    4/2007
EP    0 707 020 A2    4/1996
(Continued)

OTHER PUBLICATIONS

Bernius et al., "Progress with Light-Emitting Polymers," *Adv. Mater.*, 12(23):1737-1750 (2000).
(Continued)

*Primary Examiner* — Duc Truong
(74) *Attorney, Agent, or Firm* — Marshall, Gerstein & Borun LLP (57) ABSTRACT

A white light emitting material comprising a polymer having an emitting polymer chain and at least one emitting end capping group.

12 Claims, 4 Drawing Sheets

(51) Int. Cl.
  H01L 51/00 (2006.01)
  H05B 33/14 (2006.01)
  H01L 51/50 (2006.01)
(52) U.S. Cl.
  CPC ...... C09K 2211/185 (2013.01); H01L 51/5016 (2013.01); Y02B 20/181 (2013.01)

(56) References Cited

U.S. PATENT DOCUMENTS

| | | | |
|---|---|---|---|
| 5,798,170 | A | 8/1998 | Zhang et al. |
| 6,268,695 | B1 | 7/2001 | Affinito |
| 7,030,138 | B2 | 4/2006 | Fujimoto et al. |
| 7,094,477 | B2 | 8/2006 | Kamatani et al. |
| 7,125,998 | B2 | 10/2006 | Stossel et al. |
| 7,147,935 | B2 | 12/2006 | Kamatani et al. |
| 2002/0117662 | A1 | 8/2002 | Nii |
| 2002/0182441 | A1 | 12/2002 | Lamansky et al. |
| 2003/0091862 | A1 | 5/2003 | Tokito et al. |
| 2004/0072989 | A1 | 4/2004 | Son et al. |
| 2006/0093852 | A1 | 5/2006 | Marsitzky et al. |

FOREIGN PATENT DOCUMENTS

| | | |
|---|---|---|
| EP | 0 842 208 A1 | 5/1998 |
| EP | 0 901 176 A2 | 3/1999 |
| EP | 0 947 123 A1 | 10/1999 |
| EP | 0 949 850 A1 | 10/1999 |
| EP | 1 245 659 A1 | 10/2002 |
| GB | 2 348 316 A | 9/2000 |
| GB | 2 440 934 A | 2/2008 |
| GB | 2 442 724 A | 4/2008 |
| JP | 2002-324679 A | 11/2002 |
| WO | WO-98/10621 A1 | 3/1998 |
| WO | WO-98/57381 A1 | 12/1998 |
| WO | WO-99/48160 A1 | 9/1999 |
| WO | WO-00/48258 A1 | 8/2000 |
| WO | WO-00/53656 A1 | 9/2000 |
| WO | WO-01/19142 A1 | 3/2001 |
| WO | WO-01/81649 A1 | 11/2001 |
| WO | WO-02/44189 A1 | 6/2002 |
| WO | WO-02/45466 A1 | 6/2002 |
| WO | WO-02/066552 A1 | 8/2002 |
| WO | WO-02/068435 A1 | 9/2002 |
| WO | WO-02/081448 A1 | 10/2002 |
| WO | WO-02/084759 A1 | 10/2002 |
| WO | WO-03/091355 A2 | 11/2003 |
| WO | WO-2004/101707 A1 | 11/2004 |

OTHER PUBLICATIONS

Brown et al., "Optical Spectroscopy of Triplet Excitons and Charged Excitations in poly(*p*-phenylenevinylene) Light-Emitting Diodes," *Chem. Phys. Letts.*, 210(1,2,3):61-66 (1993).

D'Andrade et al., "Controlling Exciton Diffusion in Multilayer White Phosphorescent Organic Light Emitting Devices," *Adv. Mat.*, 14(2):147-151 (2002).

Duggal et al., "Organic Light-Emitting Devices for Illumination Quality White Light," *Appl. Phys. Letts.*, 80(19):3470-3472 (2002).

Jayawarna et al., "Nanostructured Hydrogels for Three-Dimensional Cell Culture Through Self-Assembly of Fluorenylmethoxycarbonyl-Dipeptides," *Adv. Mater.*, 16:611-617 (2006).

Jiang et al., "High-Efficiency White-Light-Emitting Devices from a Single Polymer by Mixing Singlet and Triplet Emission," *Adv. Mater.*, 18:1769-1773 (2006).

Kappaun et al., "WPLEDs Prepared from Main-Chain Fluorene-Iridium(III) Polymers," *J. Mater. Chem.*, 16:4389-4392 (2006).

Lee et al., "Synthesis and Properties of Novel Electrophosphorescent Polymers from Quinoline- and Pyridine-End-Capped Polyfluorenes with Rhenium(I) Chromophores," *J. Poly. Sci.: Part A: Poly Chem.*, 45:1492-1498 (2007).

Michaelson, "The Work Function of the Elements and its Periodicity," *J. Appl. Phys.*, 48(11):4729 (1977).

Namdas et al., "Simple Color Tuning of Phosphorescent Dendrimer Light Emitting Diodes," *Appl. Phys. Letts.*, 86:161104 (2005).

Niu et al., "Thermal Annealing Below the Glass Transition Temperature: A General Way to Increase Performance of Light-Emitting Diodes Based on Copolyfluorenes," *Appl. Phys. Letts.*, 81(4):634-636 (2002).

Setayesh et al., "Bridging the Gap Between Polyfluorene and Ladder-Poly-*p*-phenylene: Synthesis and Characterization of Poly-2,8-indenofluorene," *Macromolecules*, 33:2016-2020 (2000).

Tokito et al., "Metal Oxides as a Hole-Injecting Layer for an Organic Electroluminescent Device," *J. Phys. D: Appl. Phys.*, 29:2750-2753 (1996).

Tsuboyama et al., "Homoleptic Cyclometalated Iridium Complexes with Highly Efficient Red Phosphorescence and Application to Organic Light-Emitting Diode," *J. Am. Chem. Soc.*, 125:12971-12979 (2003).

Wohlgenannt et al., "Formation Cross-Sections of Singlet and Triplet Excitons in π-conjugated Polymers," *Nature*, 409:494-497 (2001).

Wohlgenannt et al., "Photophysics Properties of Blue-Emitting Polymers," *Synth. Met.*, 125:55-63 (2002).

Yamaguchi et al., "Effects of B and C on the Ordering of $L1_0$-CoPt Thin Films," *Appl. Phys. Letts.*, 79(13):2001-2003 (2001).

Yamamoto et al., "Electrically Conducting and Thermally Stable π-conjugated Poly(arylene)s Prepared by Organometallic Processes," *Prog. Polym. Sci.*, 17:1153-1205 (1992).

Yan et al., "Polymer White-Light-Emitting Diodes with High Work Function Cathode Based on a Novel Phosphorescent Chelating Copolymer," *Chi. Phys. Letts.*, 24(12):3547-3550 (2007).

Yang et al., "Efficient Blue Polymer Light-Emitting Diodes from a Series of Soluble Poly(paraphenylene)s," *J. Appl. Phys.*, 79(2):934-939 (1996).

Combined Search and Examination Report for Application No. GB0801227.0, dated Jul. 15, 2008.

International Preliminary Report on Patentability for Application No. PCT/GB2009/000182, dated Jul. 27, 2010.

International Search Report and Written Opinion for Application No. PCT/GB2009/000182, dated Jun. 2, 2009.

D. Neher, "Polyfluorene Homopolymers: Conjugated Liquid-Crystalline Polymers for Bright Blue Emission and Polarized Electroluminescence," *Macromol. Rapid Commun.*, 22:1365-1385 (2001).

WHITE LIGHT EMITTING MATERIAL

This application is a DIV of Ser. No. 12/864,430 filed Sep. 1, 2010, now ABN.

Luminescent conjugated polymers are an important class of materials that will be used in light emitting display devices for the next generation of information technology based consumer products. The principle interest in the use of polymers, as opposed to inorganic semiconducting and organic dye materials, lies in the scope for low-cost manufacturing, using solution-processing of film-forming materials. Since the last decade much effort has been devoted to the improvement of the emission efficiency of organic light emitting diodes (OLEDs) either by developing highly efficient materials or efficient device structures.

In OLEDs, electrons and holes are injected from opposite electrodes and are combined to form two types of excitons; spin-symmetric triplets and spin-antisymmetric singlets in a theoretical ratio of 3:1. Radiative decay from the singlets is fast (fluorescence), but from the triplets (phosphorescence) it is formally forbidden by the requirement of the spin conservation.

Initially spurred on by this understanding that the maximum internal quantum efficiency of a fluorescent OLED was limited to 25% the idea of transferring both singlets and triplets to a phosphorescent dopant was conceived. Such a phosphor typically is able to accept both singlet and triplet excitons from the organic material and generate luminescence, particularly electroluminescence from both.

In the past few years many have studied the incorporation by blending of phosphorescent materials into a semiconductive layer. In particular, this has been applied to white organic light emitting devices.

There have been several approaches to obtaining efficient white light emission. In order to make white light of sufficient quality for general illumination it is usually necessary to combine light from a number of different emitters. For example blue plus yellow or blue plus green plus red. Many potential schemes for doing this suffer from differential aging where for example the quantity of blue light decays more rapidly than the other colours. One method to avoid differential aging is to use down-conversion techniques. In "down-conversion" there is one fundamental source producing photons of the highest required energy. Some or all of these photons are then absorbed by materials known in the art as "phosphors" and re-emitted as lower energy (longer wavelength) radiation. It will be understood by the skilled person that, despite their name, these down-converting "phosphors" may re-emit absorbed light as fluorescent or phosphorescent radiation.

The standard fluorescent tube is an example of the use of down-conversion to generate illumination-quality white light. In this case the source of the photons is a mercury discharge, giving mainly blue light. Phosphors on the surface of the glass tube convert some of these photons to the yellow area of the spectrum and the combination of blue plus yellow is perceived as white. The fluorescent tubes can not be used in flat panel displays and so more recent OLEDs represent a significant advantage over these.

Applied Physics Letters 80(19), 3470-3472, 2002 discloses another approach; using an organic light emitting polymer device comprising an electroluminescent material that emits blue fluorescence. Phosphors or dyes external to the organic device absorb some of the "blue" photons and re-emit photons of lower energy, thereby "down converting" some of the blue emission to yellow. The blue and yellow emissions combine to form white emission.

As with most if not all luminescent materials, the blue electroluminescent material of this device generates both singlet and triplet excitons. However all emission in this device (i.e. blue and downconverted yellow) derives from the blue emission of the electroluminescent material which in turn is derived from singlet excitons, i.e. the triplets excitons generated by the blue electroluminescent material are not harvested. The ratio of singlet excitons to triplet excitons can be as high as 1:3 (as discussed in, for example, Chem. Phys. Lett., 1993, 210, 61, Nature (London), 2001, 409, 494, Synth. Met., 2002, 125, 55 and references therein). Consequently, as mentioned above, the theoretical maximum efficiency of this device may be as low as 25%.

One example of a white device including phosphorescent emission is disclosed in Advanced Materials, 2002, 14, No. 2, "Controlling Exciton Diffusion in Multilayer White Phosphorescent Organic Light Emitting Devices". This disclosure is concerned with a white organic light emitting device. It is said that white light emission can be obtained from multilayer OLED structures in which different layers emit different parts of the visible spectrum, from single layer polymer blends, or from hybrid organic/inorganic structures, white light-emitting materials, or exciplexes.

Advanced Materials 2002, 14, No. 2 reports the use of blue (6 wt. % FIrpic:CBP), yellow (8 wt. % Bt2Ir(acac):BCP), and red (8 wt. % Btp2Ir(acac):CBP) phosphor doped emissive regions combined in two multilayer OLEDs to produce white light.

J. Mater. Chem. 2006, 16, 4389-4392 discloses white light emission from a copolymer of a main chain fluorene unit and a main chain iridium complex.

Advanced Material 2006, 16, 611-617 is concerned with white light emitting diodes based on Iridium complexes. Blends of "BlueJ":PVK:Ir(PBPP)3:Ir(PIQ)3 are disclosed.

Advanced Material 2006, 18, 1769-1773 "High-Efficiency White Light Emitting Devices from a Single Polymer by Mixing Singlet and Triplet Emission" describes white-light emission from a single polymer, which simultaneously consists of fluorescence and phosphorescence emitting species. Benzothiadiazole units are introduced into a polyfluorene backbone and iridium complexes are introduced onto the side chain. The iridium complex is said to be a triplet red-light emission species.

In view of the above, it will be appreciated that there exists a need to provide an efficient white organic light-emitting device, which preferably is solution processable.

WO 2003/091355 discloses material capable of luminescence comprising a polymer or oligomer; and an organometallic, characterised in that the organometallic is covalently bound to the polymer or oligomer. The nature, location and/or proportion of the polymer or oligomer and of the organometallic in the material are selected so that the luminescence predominantly is phosphorescence. An organometallic end cap is shown in general formula II. Organometallic-containing end capping reagents are shown in general formulae X and XI. WO 2003/091355 is not concerned at all with and does not even mention white emission.

It is an aim of the present invention therefore to provide a new white emitting material and, further, a new white-emitting OLED.

Accordingly, a first aspect of the present invention provides a white light emitting material comprising a polymer having an emitting polymer chain and at least one emitting end capping group.

For the purposes of the present invention, "white light" means light having a CIE x coordinate equivalent to that emitted by a black body at 2500-9000K and a CIE y coordinate within 0.05 of the CIE y co-ordinate of said light emitted by a black body, preferably a CIE x coordinate equivalent to that emitted by a black body at 4000-8000K and a CIE y coordinate within 0.025 of the CIE y co-ordinate.

Surprisingly, the white light emitting material according to the present invention has been found to show good colour stability over its lifetime. Further, this material shows good efficiency when used in an OLED.

The white light emitting material as defined anywhere herein may consist of the polymer having an emitting polymer chain and at least one emitting end capping group. Typically, the polymer will be solution processable.

Alternatively, the white light emitting material may contain one or more other components, such as an external phosphor, in addition to the polymer having an emitting polymer chain and at least one emitting end capping group. An external phosphor, for example, would be capable of absorbing some of the light emitted from the polymer and re-emitting it so that the resultant light emitted from the material as a whole is white. The embodiment where the white light emitting material consists of the polymer having an emitting polymer chain and at least one emitting end capping group is considered to be preferred.

The polymer may comprise 2, 3, or even 4 or more different emitting units, each emitting a different colour; an emitting unit being a repeat unit in the polymer chain or an end capping groups.

The at least one emitting end capping group preferably is a red or yellow emitting end capping group.

Preferably, the at least one emitting end capping group is a phosphorescent end capping group. When the at least one emitting end capping group is a phosphorescent end capping group, the white light emitting material has been found to show improved efficiency when used in an OLED as compared with an all-fluorescent white light emitting material.

A preferred phosphorescent end capping group contains a carbon-metal bond. Preferred metals include Pt, Pd, Os, Au, Ru, Re, and Ir, most preferably Ir. Preferably, ligands surround the metal in a phosphorescent end capping group. Preferred ligands include bidentate biaryl ligands, in particular C,N-cyclometalating ligands. Examples of red-emitting C,N-cyclometalating ligands include optionally substituted 2-thienylpyridine; 2-phenylquinoline; and 2-phenylisoquinoline. By increasing the extent of conjugation in the ligands, the colour of emission of the phosphorescent end capping group can be moved from yellow, through orange to red.

Typically, the polymer will be a linear polymer. Where the polymer is a linear polymer, the polymer according to one embodiment preferably has two emitting end capping groups:

emitting end capping group-emitting polymer chain-
emitting end capping group                1

In another preferred embodiment, the polymer is a linear polymer with only one emitting end-capping group, the other end-capping group being a non-emitting end-capping group derived from a material in the polymerisation mixture or an end-capping material added at the end of the polymerisation.

Preferably, the emitting polymer chain comprises at least one fluorescent repeat unit.

Preferably, the emitting polymer chain comprises a first emitting repeat unit and a second emitting repeat unit, where the first and second repeat units emit light of different colours.

An "emitting repeat unit" in the polymer chain may emit from a side group, pendent from the main chain. Alternatively, an "emitting repeat unit" in the polymer chain may emit from a unit that is part of the main chain.

The emitting polymer chain may further contain at least one non-emitting repeat unit, such as a charge transport repeat unit. For example, the emitting polymer chain may contain a fluorene charge transport repeat unit.

Preferably, the emitting polymer chain comprises a first fluorescent repeat unit and a second fluorescent repeat unit, where the first and second repeat units emit light of different colours.

Preferably, the emitting polymer chain comprises a first repeat unit that is a blue (preferably fluorescent) repeat unit and a second repeat unit that is a green (preferably fluorescent) repeat unit.

Preferred blue fluorescent repeat units comprise an amine group, more preferably a triarylamine group. Preferred triarylamine groups are shown below in formula 2:

2 wherein $Ar^1$ and $Ar^2$ are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 2 (that is, $Ar^1$, $Ar^2$ and R) may be substituted. Preferred substituents include alkyl and alkoxy groups. Any of the aryl or heteroaryl groups in the repeat unit of Formula 2 may be linked by a direct bond or a divalent linking atom or group. Preferred divalent linking atoms and groups include O, S; substituted N; and substituted C.

Particularly preferred units satisfying Formula 2 include units of Formulae 3 to 5:

3a

4a

5a wherein $Ar^1$ and $Ar^2$ are as defined above, with the proviso that the central $Ar^2$ group in the repeat unit of formula 3 is a monocyclic aromatic or heteroaromatic group; and $Ar^3$ is optionally substituted aryl or heteroaryl. Where present, preferred substituents for $Ar^3$ include alkyl and alkoxy groups. Any two of $Ar^1$, $Ar^2$ and $Ar^3$ in the repeat units of Formulae 3-4 may be linked by a direct bond or a divalent linking atom or group, as described above with respect to Formula 2. Where present, the divalent linking atom or group preferably links two groups $Ar^1$, $Ar^2$ and $Ar^3$ that are linked to a common N atom.

Additional preferred units satisfying Formula 2 include units of Formulae 3a to 5a:

where Ar1 and Ar2 are as defined in relation to Formulae 3 to 5 and R3 represents alkyl.

Preferred green fluorescent repeat units comprise benzothiadiazole; quinoxaline; distyrylbenzene; and repeat units of formula 3 above wherein the central Ar2 group is a polycyclic aromatic or heteroaromatic group such as fluorene, anthracene, naphthalene and phenanthrene. Each of these units may optionally be substituted. Preferred substituents are alkyl, alkoxy and aryl or heteroaryl, in particular phenyl. Exemplary green emitting units are illustrated below.

Most preferably, the emitting polymer chain comprises a first fluorescent repeat unit and a second fluorescent repeat unit and the polymer has one or two phosphorescent end capping groups, although the skilled person will appreciate that the polymer may comprise three or more end-capping groups, for example in the case of a branched polymer such as a star polymer.

In one embodiment, the emitting polymer chain comprises a blue (preferably fluorescent) repeat unit and the one or two end capping groups are red emitting (preferably phosphorescent) end capping groups.

In another embodiment, the emitting polymer chain comprises a blue (preferably fluorescent) repeat unit and the two end capping groups are yellow emitting (preferably phosphorescent) end capping groups.

In still another embodiment, the emitting polymer chain comprises a green (preferably fluorescent) repeat unit and a blue (preferably fluorescent) repeat unit and the two end capping groups are red (preferably phosphorescent) emitting end capping groups.

In still another embodiment, the emitting polymer chain comprises a green (preferably fluorescent) repeat unit and a blue (preferably fluorescent) repeat unit emitter and the two end capping groups are yellow (preferably phosphorescent) emitting end capping groups.

In still another embodiment, the emitting polymer chain comprises a green (preferably fluorescent) repeat unit and a blue (preferably fluorescent) repeat unit and one end capping group is a red (preferably phosphorescent) emitting end capping group and the other is a yellow (preferably phosphorescent) emitting end capping group.

For the purposes of the present invention, the colour of a repeat unit in the emitting polymer chain is determined by the emission peak in the PL spectrum of a Suzuki-polymerised copolymer of 95 mol % dioctylfluorene: 5 mol % emitting repeat unit. The colour of an end capping group is determined similarly. The colour of the emitting repeat unit or end capping group is determined from the emission peak as follows:

| Emission peak in the range | Colour |
|---|---|
| <495 nm | Blue |
| >595 nm | Red |
| >495 nm, up to and including 560 nm | Green |
| >560 nm, up to and including 585 nm | Yellow |
| >585 nm, up to and including 595 nm | Orange |

A second aspect of the present invention provides a method for making a white light emitting material as defined in relation to the first aspect of the invention, said method including the step of polymerising monomers from a polymer feed to form the emitting polymer chain and end capping the polymer chain using an end capping reagent.

Typically, the polymer will be solution processable.

In the method according to the second aspect, the end capping reagent preferably is added to the polymer feed at the outset of or during polymerisation. This has been found to be a means to control the emission colour of the finished polymer. The embodiment where the end capping reagent is added to the polymer feed after polymerisation is not however excluded.

In the method according to the second aspect, in the embodiment where the at least one end capping group contains a carbon-metal bond, the end capping reagent, in the form in which it is added to the polymer feed, preferably contains a metal. That is to say, the metal is not subsequently attached to the end capping group after the end capping reagent has reacted to end cap the product polymer. However, it will be appreciated that the end-capping group may be added to the reaction mixture in a form in which the metal is absent, with the metal being added after end-capping has occurred.

The polymer feed may comprise 2, 3, or even 4 or more different monomers, each monomer providing a different emitting repeat unit in the emitting polymer chain of the product polymer.

The polymer feed preferably includes end capping reagents for providing red and/or yellow emitting end capping groups in the product polymer.

The polymer feed preferably includes end capping reagents for providing phosphorescent end capping groups in the product polymer.

The polymer feed preferably includes monomers for providing a first (preferably fluorescent) emitting repeat unit and monomers for providing a second (preferably fluorescent) emitting repeat unit, where the first and second repeat units emit light of different colours in the product polymer.

The polymer feed preferably includes monomers for providing non-emitting repeat units, such as charge transport repeat units, in the product polymer.

In one embodiment, the polymer feed preferably includes monomers for providing blue (preferably fluorescent) repeat units and end capping reagents for providing red emitting (preferably phosphorescent) end capping groups.

In another embodiment, the polymer feed preferably includes monomers for providing blue (preferably fluorescent) repeat units and end capping reagents for providing yellow emitting (preferably phosphorescent) end capping groups.

In still another embodiment, the polymer feed preferably includes monomers for providing green (preferably fluorescent) repeat units and monomers for providing blue (preferably fluorescent) repeat units and end capping reagents for providing red (preferably phosphorescent) emitting end capping groups.

In still another embodiment, the polymer feed preferably includes monomers for providing green (preferably fluorescent) repeat units and monomers for providing blue (preferably fluorescent) repeat units and end capping reagents for providing yellow (preferably phosphorescent) emitting end capping groups.

In still another embodiment, the polymer feed preferably includes monomers for providing green (preferably fluorescent) repeat units and monomers for providing blue (preferably fluorescent) repeat units and end capping reagents for providing red (preferably phosphorescent) emitting end capping groups and end capping reagents for providing yellow (preferably phosphorescent) emitting end capping groups.

The emission colour of the resulting polymer can be controlled by controlling the relative ratios of the monomers and end capping reagents in the polymer feed.

White emission from a combination of emitters, such as a combination of red, green and blue emitters, requires a preponderance of the blue emitter because the blue emitter has the largest HOMO-LUMO bandgap of the three, whereas emission tends to occur from the lowest bandgap species. Therefore, the mol % of the blue emitter is preferably at least 10 times that of the red emitter.

Preferred mol % in the polymer feed of monomers providing a blue repeat unit are as follows:

|  | Preferred | More preferred |
|---|---|---|
| blue | 1-20 mol % | 3-10 mol % |

Preferred mol % in the polymer feed of monomers providing a green repeat unit are as follows:

|  | Preferred | More preferred | Most preferred |
|---|---|---|---|
| green | 0-1 mol % | 0.01-0.5 mol % | 0.05-0.15 mol % |

Preferably the end capping reagent is present in the polymer feed at a mol % in the range 0.01 to 0.5 mol %, more preferably in the range of from 0.05 to 0.15 mol %.

A third aspect of the present invention provides an OLED containing a white light emitting material comprising a polymer having an emitting polymer chain and at least one emitting end capping group, as defined anywhere herein.

Figure 1:
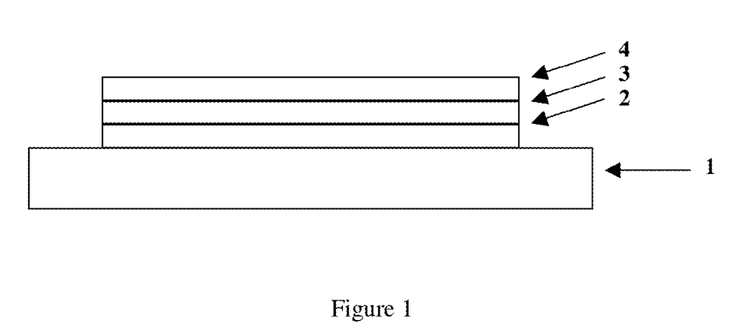
FIG. 1 shows the basic architecture of an OLED according to the third aspect.

With reference to FIG. 1, the architecture of an OLED according to the third aspect of the invention comprises a transparent glass or plastic substrate 1, an anode 2 and a cathode 4. An emitting layer 3 is provided between anode 2 and cathode 4.

The white light emitting material may be present alone in the emitting layer of the device or may be blended with one or more other materials in the emitting layer. In particular, the white light-emitting material may be blended with hole and/or electron transporting materials as disclosed in, for example, WO 99/48160, or may comprise a luminescent dopant in a semiconducting host matrix.

In a practical device, at least one of the electrodes is semi-transparent in order that light may be absorbed (in the case of a photoresponsive device) or emitted (in the case of an OLED). Where the anode is transparent, it typically comprises indium tin oxide.

Further layers may be located between anode 2 and cathode 3, such as charge transporting, charge injecting or charge blocking layers.

In particular, it is desirable to provide a conductive hole injection layer, which may be formed from a conductive organic or inorganic material provided between the anode 2 and the emitting layer 3 to assist hole injection from the anode into the layer or layers of semiconducting polymer. Examples of doped organic hole injection materials include doped poly (ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and poly(thienothiophene). Examples of conductive inorganic materials include transition metal oxides such as VOx MoOx and RuOx as disclosed in Journal of Physics D: Applied Physics (1996), 29(11), 2750-2753.

If present, a hole transporting layer located between anode 2 and emitting layer 3 preferably has a HOMO level of less than or equal to 5.5 eV, more preferably around 4.8-5.5 eV. HOMO levels may be measured by cyclic voltammetry, for example.

If present, an electron transporting layer located between emitting layer 3 and cathode 4 preferably has a LUMO level of around 3-3.5 eV.

Cathode 4 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of a low workfunction material and a high workfunction material such as calcium and aluminium as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode will comprise a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to preventingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

The embodiment of FIG. 1 illustrates a device wherein the device is formed by firstly forming an anode on a substrate followed by deposition of an electroluminescent layer and a cathode, however it will be appreciated that the device of the invention could also be formed by firstly forming a cathode on a substrate followed by deposition of an electroluminescent layer and an anode.

A fourth aspect of the present invention provides a light source comprising an OLED as defined in relation to the third aspect of the invention. Light sources include light bulbs and displays, for example.

In the fourth aspect, the emitting layer 3 of the OLED may be patterned or unpatterned. A device comprising an unpatterned layer may be used an illumination source, for example. A white light emitting device is particularly suitable for this purpose. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

The present invention now will be described in more detail with reference to the attached Figures in which.

Suitable electroluminescent and/or charge transporting polymers include poly(arylene vinylenes) such as poly(p-phenylene vinylenes) and polyarylenes.

Polymers preferably comprise a first repeat unit selected from arylene repeat units as disclosed in, for example, Adv. Mater. 2000 12(23) 1737-1750 and references therein. Exemplary first repeat units include: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as C1-20 alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably repeat units of formula 6:

6 wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

Polymers may provide one or more of the functions of hole transport, electron transport and emission depending on which layer of the device it is used in and the nature of co-repeat units.

In particular:
  a homopolymer of fluorene repeat units, such as a homopolymer of 9,9-dialkylfluoren-2,7-diyl, may be utilised to provide electron transport.
  a copolymer comprising triarylamine repeat unit may be utilised to provide hole transport, in particular a copolymer comprising a repeat unit as shown by formula 2:

wherein Ar¹ and Ar² are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 1 may be substituted. Preferred substituents include alkyl and alkoxy groups. Any of the aryl or heteroaryl groups in the repeat unit of Formula 1 may be linked by a direct bond or a divalent linking atom or group. Preferred divalent linking atoms and groups include O, S; substituted N; and substituted C.

Particularly preferred units satisfying formula 2 include units of formulae 3 to 5:

wherein Ar¹ and Ar² are as defined above; and Ar³ is optionally substituted aryl or heteroaryl. Where present, preferred substituents for Ar³ include alkyl and alkoxy groups.

Additional preferred units satisfying Formula 2 include units of Formulae 3a to 5a:

where Ar¹ and Ar² are as defined in relation to Formulae 3 to 5 and R³ represents alkyl.

Particularly preferred hole transporting polymers of this type are copolymers of the first repeat unit and a triarylamine repeat unit.

Polymerisation Methods

Preferred methods for preparation of these polymers are Suzuki polymerisation as described in, for example, WO 00/53656 and Yamamoto polymerisation as described in, for example, T. Yamamoto, "Electrically Conducting And Thermally Stable π-Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

Solution Processing

A single polymer or a plurality of polymers may be deposited from solution to form layer 5. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full colour displays. Inkjet printing of OLEDs is described in, for example, EP 0880303.

Other solution deposition techniques include dip-coating, roll printing and screen printing.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

Preferred phosphorescent metal complexes comprise optionally substituted complexes of formula 22:

$$ML^1_qL^2_rL^3_s \qquad 22$$

wherein M is a metal; each of L1, L2 and L3 is a coordinating group; q is an integer; r and s are each independently 0 or in integer; and the sum of (a.q)+(b.r)+(c.s) is equal to the number of coordination sites available on M, wherein a is the number of coordination sites on L1, b is the number of coordination sites on L2 and c is the number of coordination sites on L3.

Heavy elements M induce strong spin-orbit coupling to allow rapid intersystem crossing and emission from triplet or higher states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals are particularly suitable for emission from triplet excited states. These metals form organometallic complexes with carbon or nitrogen donors such as porphyrin or bidentate ligands of formula 23:

23 wherein $Ar^4$ and $Ar^5$ may be the same or different and are independently selected from optionally substituted aryl or heteroaryl; X1 and Y1 may be the same or different and are independently selected from carbon or nitrogen; and $Ar^4$ and $Ar^5$ may be fused together. Ligands wherein X1 is carbon and Y1 is nitrogen are particularly preferred.

The colour of emission of the phosphorescent emitter may be tuned by appropriate selection of metal, ligand and substituents therefor. For example phosphorescent iridium complexes include red phosphorescent emitters comprising thienyl-pyridine ligands as disclosed in Appl. Phys. Letters 2005, 86, 161104 or phenylquinoline or phenyl-isoquinoline ligands as disclosed in Tsuboyama et al, J. Am. Chem. Soc. 2003, 125, 12971-12979; green phosphorescent emitters comprising phenylpyridine ligands; and blue phosphorescent emitters comprising phenyl-triazole ligands as disclosed in WO 2004/101707 or fluorinated phenylpyridine ligands.

Examples of bidentate ligands are illustrated below:

-continued

Each of $Ar^4$ and $Ar^5$ may carry one or more substituents. Two or more of these substituents may be linked to form a ring, for example an aromatic ring. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

A light-emitting dendrimer, such as a dendrimeric end-group, typically comprises a light-emitting core bound to one or more dendrons, wherein each dendron comprises a branching point and two or more dendritic branches. Preferably, the dendron is at least partially conjugated, and at least one of the core and dendritic branches comprises an aryl or heteroaryl group.

Other ligands suitable for use with d-block elements include diketonates, in particular acetylacetonate (acac); tri-arylphosphines and pyridine, each of which may be substituted.

Main group metal complexes show ligand based, or charge transfer emission. For these complexes, the emission colour is determined by the choice of ligand as well as the metal.

The host material should have a T1 energy level sufficiently high for excited state energy to be transferred from the T1 energy level of the host to the T1 level of the emitter. Preferably, the host has a T1 energy level sufficiently high to prevent energy back-transfer from the T1 energy level of the emitter back to the host, and in particular a T1 energy level higher than that of the emitter. However, in some cases the T1 energy level of the host may be the same, or even lower, than that of the emitter.

EXAMPLE

Polymers were prepared using standard Suzuki polymerisation conditions. Polymers were formed by polymerising a blue and a green fluorescent monomer as described above with fluorene monomers according to formula 6 above. All monomers were added at the beginning of the polymerisation including a red phosphorescent emitter as described above which was a mono-bromide, rather than dibromide. This effectively acts as an end-capping agent, added at the beginning of the reaction. This helps limit the molecular weight and separates the emitters. To study the effect of the end-capping group on the colour of the polymer, 3 polymers (Polymers 1-3) were formed with decreasing amounts of phosphorescent end-capping material. Upon completion of polymerisation, bromobenzene and phenylboronic acid were added to the reaction mixture to end-cap any polymer chains not already capped with the phosphorescent emitter.

For the purpose of comparison, the polymers according to the invention were compared with a fluorescent white-emitting polymer comprising red, green and blue fluorescent emitters in the polymer chain.

Figure 2:
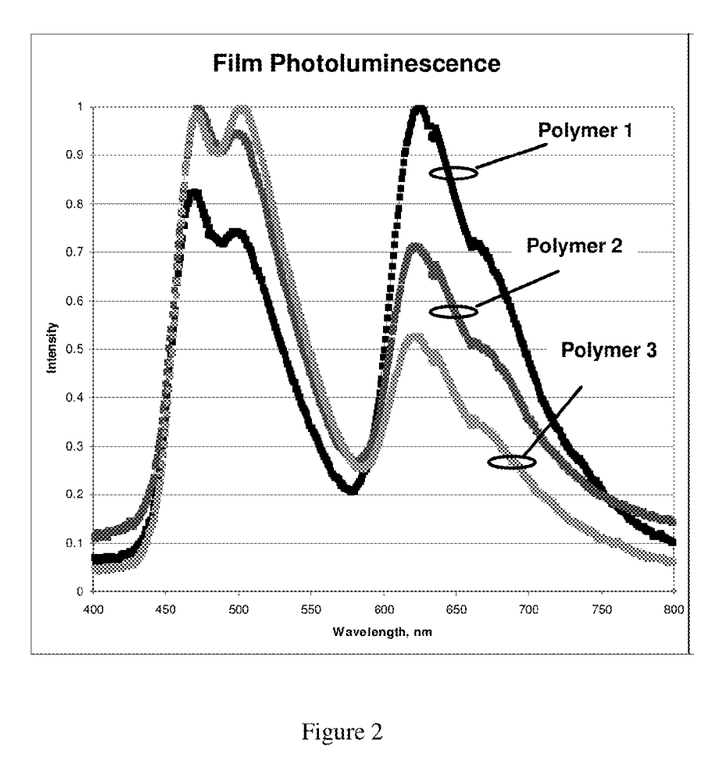
FIG. 2 shows the film PL spectra of Polymers 1 to 3, as measured by standard techniques.

The film PL spectra of Polymers 1 to 3, as measured by standard techniques, are shown in FIG. 2.

Figure 3:
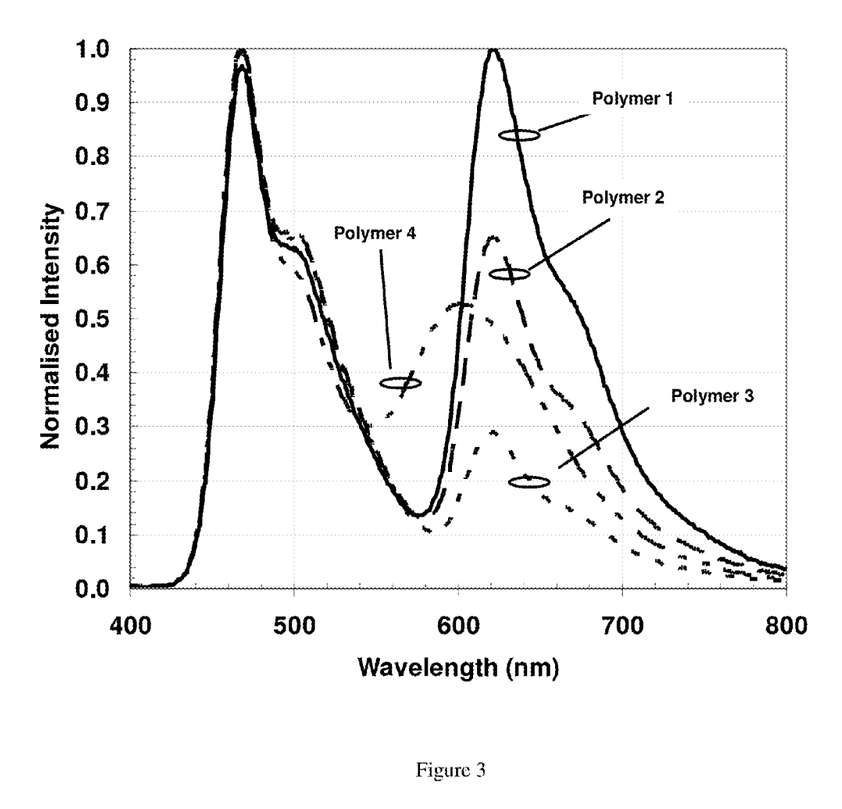
FIG. 3 shows the EL spectra of Polymers 1 to 3, measured under DC driving conditions.

The EL spectra of Polymers 1 to 3, measured under DC driving conditions at a brightness of 400 cd/m2, using a Ocean Optics spectrometer are shown in FIG. 3. These are compared to the EL spectra of Polymer 4, measured under the same conditions.

Results of CIE x and y coordinate measurements, measured using a Minolta CS200 ChromaMeter, are given below.

| Polymer | Minolta CIE x | Minolta CIE y |
|---------|---------------|---------------|
| Polymer 1 | 0.363 | 0.315 |
| Polymer 2 | 0.310 | 0.319 |
| Polymer 3 | 0.246 | 0.322 |
| Polymer 4 | 0.337 | 0.337 |

It can be seen from the above results that the colour of the polymer can be controlled by adjusting the quantity of end-capping phosphorescent material used.

The table below compares the CIE coordinates of Polymers 2 and 4.

| Polymer | Undriven CIE | Driven CIE | Delta CIE x | Delta CIE y |
|---------|--------------|------------|-------------|-------------|
| Polymer 2 | (0.311, 0.320) | (0.291, 0.301) | −0.020 | −0.019 |
| Polymer 4 | (0.339, 0.339) | (0.322, 0.323) | −0.017 | −0.016 |

A change in CIE is observed between a fluorescent red-based white (Polymer 4) and a phosphorescent red-based white (Polymer 2).

Figure 4:
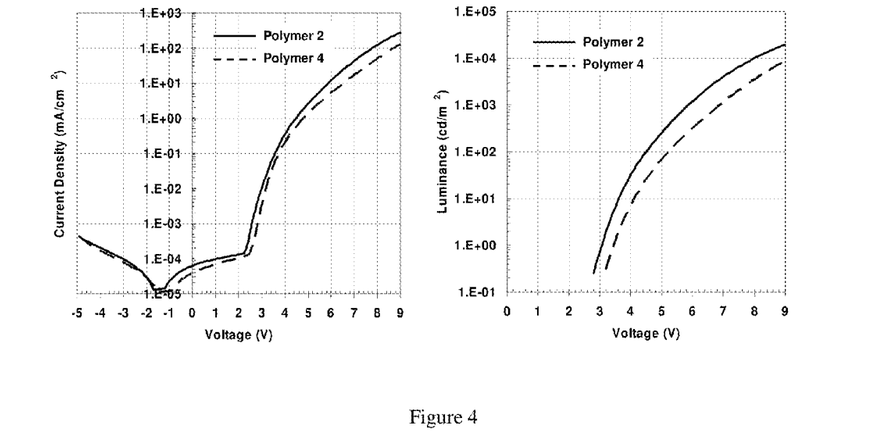
FIGS. 4 to 6 show IVL & LT plots relating to Polymers 2 and 4.
Figure 5:
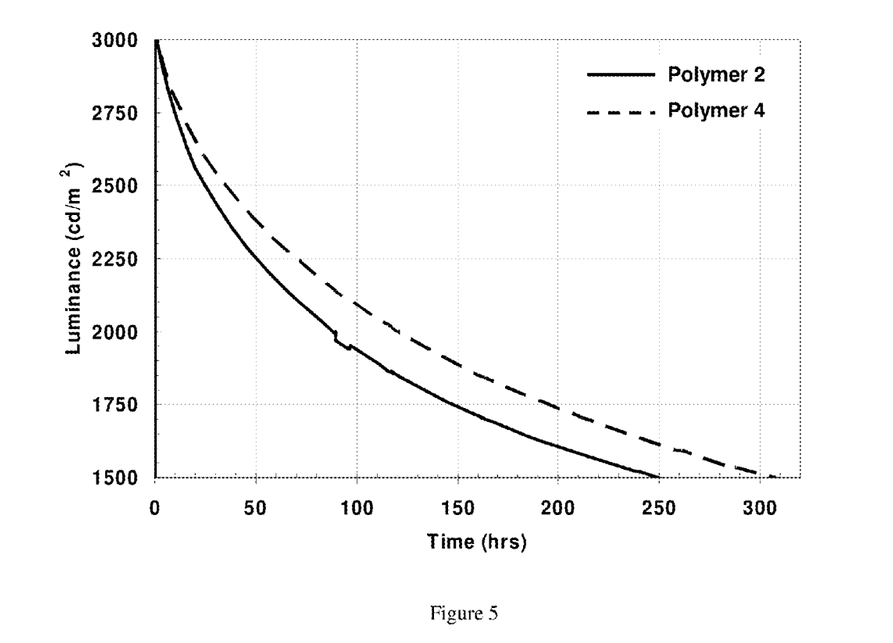
Figure 6:
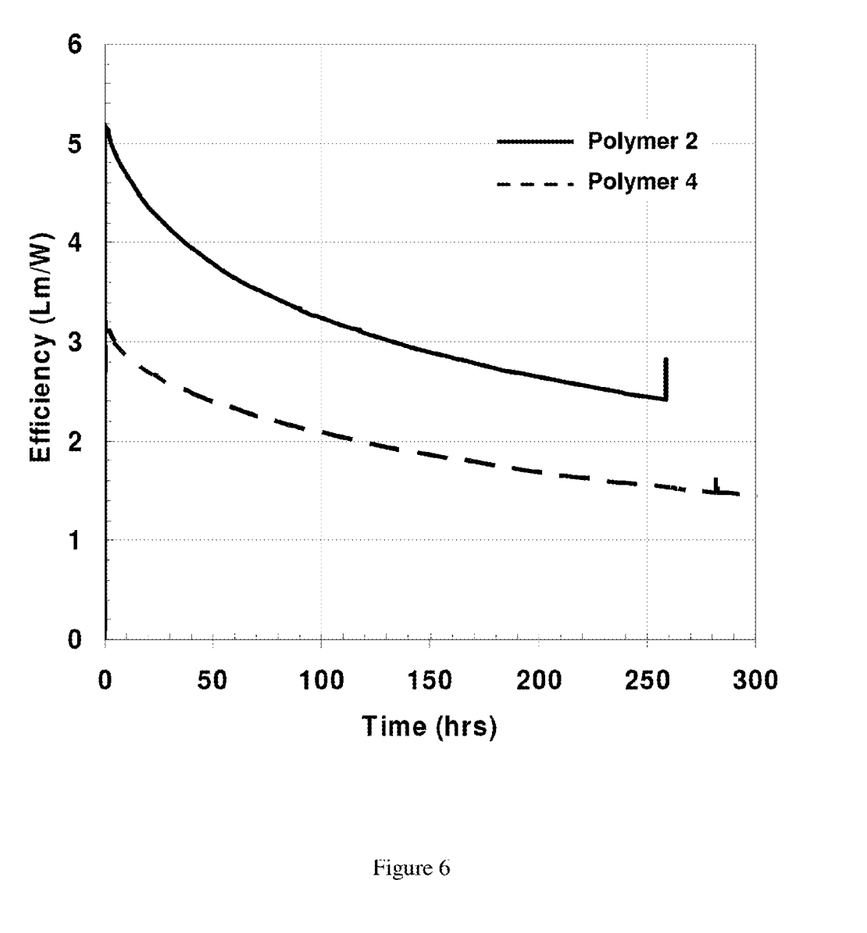

IVL & lifetime plots shown in FIGS. 4 to 6 relate to Polymers 2 and 4.

The invention claimed is:

1. A method for making a white light emitting material comprising a polymer having an emitting polymer chain and at least one emitting end-capping group, said method including the steps of polymerizing monomers from a polymer feed to form the emitting polymer chain and end-capping the polymer chain using at least one end-capping reagent, thereby making a white light emitting material, wherein the at least one end-capping reagent is added to the polymer feed at the outset of or during polymerization, wherein the at least one end-capping reagent is a phosphorescent metal complex, wherein the polymer chain comprises at least one light-emitting unit, and wherein the at least one end-capping reagent and the at least one light-emitting unit emit different colors.

2. The method according to claim 1, wherein the material consists of the polymer having an emitting polymer chain and the at least one end-capping reagent.

3. The method according to claim 1, wherein the polymer comprises 2, 3, or 4 or more different emitting units, each emitting a different color, the emitting units being a repeat unit in the polymer chain or the at least one end-capping reagent.

4. The method according to claim 1, wherein the phosphorescent metal complex contains a carbon-metal bond.

5. The method according to claim 4, wherein the metal is selected from the group consisting of Pt, Pd, Os, Au, Ru, Re, and Ir.

6. The method according to claim 4, wherein the metal is Ir.

7. The method according to claim 1, wherein the emitting polymer chain comprises at least one fluorescent repeat unit.

8. The method according to claim 7, wherein the fluorescent repeat unit is a blue repeat unit.

9. The method according to claim 1, wherein the blue repeat unit comprises an amine group.

10. The method according to claim 8, wherein the emitting polymer chain further comprises a green fluorescent repeat unit.

11. The method according to claim 1, wherein the polymer has end-capping reagents selected from the group consisting of red phosphorescent end-capping reagents and yellow phosphorescent end-capping reagents.

12. The method according to claim 1, wherein the emitting polymer chain further contains at least one non-emitting repeat unit.

* * * * *